(12) United States Patent
Hagari

(10) Patent No.: US 7,081,788 B2
(45) Date of Patent: Jul. 25, 2006

(54) BAND PASS FILTER

(75) Inventor: Hideki Hagari, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/949,276

(22) Filed: Sep. 27, 2004

(65) Prior Publication Data

US 2005/0253647 A1   Nov. 17, 2005

(30) Foreign Application Priority Data

May 13, 2004   (JP)   ............... 2004-143607

(51) Int. Cl.
*H03K 5/00*   (2006.01)

(52) U.S. Cl. ...................................... 327/553; 327/557

(58) Field of Classification Search ........ 327/552–559; 330/303, 305
See application file for complete search history.

(56) References Cited

U.S. PATENT DOCUMENTS

| 6,057,723 A | * | 5/2000 | Yamaji et al. | ............... 327/237 |
| 6,161,425 A | * | 12/2000 | Junker et al. | ................. 73/49.5 |
| 6,791,401 B1 | * | 9/2004 | Miwa | ......................... 327/556 |

OTHER PUBLICATIONS

M. E. Van Valkenburg, Analog Filter Design ,"Chapter 5, Chapter 7, Chapter 17", Holt, Rinehart and Winston, 1982.

* cited by examiner

*Primary Examiner*—Dinh T. Le
(74) *Attorney, Agent, or Firm*—Sughrue Mion, PLLC

(57) ABSTRACT

A band pass filter includes a first band pass filter constructed of a biquad circuit and having a first center frequency, and a second bandpass filter constructed of a biquad circuit and having a second center frequency different from the first center frequency, and the first band pass filter and the second band pass filter are series connected, in which the first band pass filter and the second band pass filter have center frequency adjusting variable resistors varied at the same time, and a fixed resistor is connected in parallel to the center frequency adjusting variable resistor of one of the first band pass filter and the second band pass filter. As a result, the center frequency and/or the maximum gain can be made variable while the band width is fixed.

9 Claims, 8 Drawing Sheets

11 : FARST BAND PASS FILTER
21 : SECOND BAND PASS FILTER
R1, R2, R5, R6, R7, R8, R9, R10, R11', R12' : FIXED RESISTOR
R3, R4, R11, R12 : VARIABLE RESISTOR
OP1, OP2, OP3, OP4 : OPERATIONAL AMPLIFIER

11 : FARST BAND PASS FILTER
21 : SECOND BAND PASS FILTER
R1, R2, R5, R6, R7, R8, R9, R10, R11', R12' : FIXED RESISTOR
R3, R4, R11, R12 : VARIABLE RESISTOR
OP1, OP2, OP3, OP4 : OPERATIONAL AMPLIFIER

R21, R22 : VARIABLE RESISTOR

BAND PASS FILTER

BACKGROUND OF THE INVENTION

1. Field of the Invention

The present invention relates to a band pass filter which is a high order band pass filter obtained by series connecting plural secondary band pass filters having different center frequencies and can change its characteristics.

2. Description of the Related Art

Band pass filters used for various signal processing devices are often constructed of analog circuits, and most of them are used in such a state that characteristics (that is, maximum gain, band width, and center frequency) of the band pass filter are fixed.

FIG. 5 is a view showing the characteristics of a general second order band pass filter.

In the drawing, $\omega 0$ denotes a center frequency, $G0$ denotes a maximum gain, and $\omega b$ denotes a band width.

Some band pass filters can vary their characteristics by using characteristic variable parts (that is, parts for making the characteristics of the band pass filter variable) such as variable resistors and variable capacitors, or by using a resistance variable technique by switching of switched capacitors, switched resistors or the like.

The characteristic variable part is often used for a device in which the characteristics of the band pass filter is manually changed (for example, a device in which a tuning frequency is manually changed by using the band pass filter constructed of a coil and a variable capacitor) or for finely adjusting the frequency characteristic variation and error of the band pass filter.

In the case where the resistance variable technique by switching is used, since the characteristics can be changed using a control signal from the outside, such as a frequency, the band pass filter can be applied to a device in which characteristics are automatically changed according to a control condition or the like.

Besides, when the resistance variable technique by switching of the switched capacitor, the switched resistor or the like is used, it becomes possible to change the characteristics by a control signal (that is, a switching frequency) from the outside, a single circuit structure can support many frequencies, and there are obtained great effects such as reduction in cost by commonality of parts.

From these, the band pass filters which can vary the characteristics are used for many signal processing devices.

A specific example of a second order band pass filter which can vary a specified band pass filter characteristic (characteristic of one of maximum gain, band width and center frequency) will be described.

As such a band pass filter, a multiple feedback circuit (also called a friend circuit) shown in FIG. 6 and a biquad circuit shown in FIG. 7 are common.

In FIGS. 6 and 7, R1, R2, R3, . . . denote fixed resistors, C1, C2, . . . denote capacitors, and OP1, OP2 . . . denote operational amplifiers.

For example, in the case where a second order band pass filter which can vary filter characteristics is constructed by using the multiple feedback circuit shown in FIG. 6, for example, when the resistor R2 is made a variable resistor, only the center frequency can be made variable. This can be explained from the transfer function of the multiple feedback circuit.

The transfer function of this circuit is given by $$G(s)=-(1/(R1*C2))*s/(s^2+((C1+C2)/(C1*C2*R3))*s+1/(R3*C1*C2)*(1/R1+1/R2))),$$

and the respective characteristics (maximum gain ($G0$), band width ($\omega b$), and center frequency ($\omega 0$)) are expressed by following expressions. Incidentally, "^" of s^2 means a power (involution), and s^2 means $s^2$.

$$G0=(C1*R3)/((C1+C2)*R1)$$

$$\omega b=(C1+C2)/(C1*C2*R3)$$

$$\omega 0=\mathrm{sqrt}(1/(C1*C2*R3)*(1/R1+1/R2)))$$

Incidentally, sqrt( )=$\sqrt{}$, and sqrt(A) means the square root of A (the same shall apply hereinafter).

That is, sqrt(1/(C1*C2*R3)*(1/R1+1/R2)) means $\{[1/(C1*C2*R3)]*(1/R1+1/R2)\}^{1/2}$.

From the above expressions, since R2 has an influence on only the center frequency characteristic, when only R2 can be made variable, only the center frequency can be made variable.

On the contrary, in the case where an element other than R2 is made variable, the respective characteristics are influenced.

In the case where a second order band pass filter which can vary filter characteristics is constructed by using the biquad circuit shown in FIG. 7, when the resistor R1 is made a variable resistor, only the maximum gain can be made variable, and when one of the resistors R3, R4, R5 and R6 is made a variable resistor, or C2 is made a variable capacitor, only the center frequency can be made variable.

This can also be explained from the transfer function of the biquad circuit.

The transfer function of this circuit is given by $$G(s)=(1/(R1*C1))*s/(s^2+(1/(C1*R2))*s+R6/(C1*C2*R3*R4*R5)),$$

and the respective characteristics (maximum gain ($G0$), band width ($\omega b$), and center frequency ($\omega 0$)) are expressed by following expressions.

$$G0=R2/R1$$

$$\omega b=1/(C1*R2)$$

$$\omega 0=\mathrm{sqrt}(R6/(C1*C2*R3*R4*R5))$$

From the above expressions, since R1 has an influence on only the maximum gain, and R3, R4, R5, R6 and C2 have an influence on only the center frequency characteristic, when these resistors or capacitance can be made variable, only the maximum gain and the center frequency can be made variable.

Also in the case of the biquad circuit, in the case where an element other than R1, R3, R4, R5, R6 and C2 is made variable, the respective characteristics are influenced.

When such a circuit is used, the filter characteristic can be made variable by making a specified element of the band pass filter variable.

Besides, as a method of making a specified element variable, as described above, there is a method of using a characteristic variable part such as a variable resistor and a variable capacitor, or a resistance variable technique using a switched capacitor or a switched resistor which makes a resistance value variable by switching.

Next, also with respect to the switched capacitor and the switched resistor, specific examples will be described.

FIG. 8 is a model diagram of the switched capacitor.

In the case where a switch Sc is switched at a frequency $f_{CLK}$, a current flowing through a capacitor C is expressed by $$ic = C*(Vin-Vout)/T_{CLK} = C*f_{CLK}*(Vin-Vout).$$

When the switched capacitor is written as an equivalent resistance Rc, $$Rc = (Vin-Vout)/ic = 1/(C*f_{CLK}).$$

The above expression indicates that the equivalent resistance Rc is obtained by switching on and off the capacitor C at a frequency fc.

FIG. 9 is a model view of the switched resistor.

In the case where a switch Sr is switched on and off at an off duty α%, a current flowing through a resistor Rb is expressed by, when consideration is given to the fact that the current flows only hen the switch Sr is switched off, $$ir = \alpha*Vin/(Ra+Rb).$$

When the switched resistor is written as an equivalent resistance Rr, $$Rr = Vin/ir = (Ra+Rb)/\alpha$$

The above expression indicates that the equivalent resistance Rr is obtained by switching on and off the resistors Ra and Rb at the off duty α%.

In the second order band pass filter as described above, when the switched capacitor or the switched resistor is used as the resistor for making the filter characteristic variable, the filter characteristic of the band pass filter can be made variable by a control signal (frequency signal) from the outside.

That is, in the case of the switched capacitor shown in FIG. 8, the frequency signal indicated by $f_{CLK}(1/T_{CLK})$ is the control signal from the outside, and in the case of the switched resistor shown in FIG. 9, the frequency signal indicated by $f_{CLK}(1/T_{CLK})$ is the control signal from the outside.

The equivalent resistance value can be changed by changing the frequency of the control signal from the outside.

In general, an object of using a signal processing device with such a band pass filter is to extract (amplify) only a signal component of a required frequency band, and to attenuate a signal in a frequency band other than that.

However, since the filter characteristics of the second order band pass filter other than the maximum gain are theoretically determined by only the center frequency and the band width, there is a case where objective frequency characteristics can not be obtained.

For example, in the case where noise is mixed in the vicinity of the required frequency band, there has been a case where a noise removal effect can not be sufficiently obtained.

In this case, the characteristics are often improved by using a high order band pass filter obtained by series connecting the second order band pass filters.

In the case where a fourth order band pass filter is obtained by series connecting two band pass filters, there are generally two kinds of systems, that is, a single tuning system in which the second order band pass filters having identical center frequencies are series connected, and a stagger tuning system in which the second order band pass filters having different center frequencies are series connected.

FIG. 10 is a view showing filter characteristics in the case of the single tuning system, and FIG. 11 is a view showing filter characteristics in the case of the stagger tuning system.

First, consideration will be given to a case where the respective characteristics of the fourth order band pass filter of the single tuning system are made variable. In the single tuning system, when the band width of each of the pair of the second order band pass filters is kept fixed and the maximum gain of at least one of them is changed, the maximum gain of the whole of the fourth order band pass filter is changed.

When the band width of each of the pair of the second order band pass filters is kept fixed and the center frequencies of the respective second order band pass filters are made variable while the center frequencies have the same value, the centre frequency of the fourth order band pass filter can be made variable while the band width thereof is fixed.

That is, in the case of the single tuning system, the high order band pass filter can be easily made variable by the foregoing conventional method.

However, in the case of the single tuning system, also as shown in FIG. 10, in the case where the attenuation characteristic at a skirt part is desired to be enhanced, the steepness in a passing region becomes high, and it has been difficult to widen the band width. On the contrary, in the case where the band width is desired to be widened, it has been difficult to enhance the attenuation characteristic at the skirt part.

On the other hand, when the stagger tuning system is used, even if the attenuation characteristic at the skirt part is enhanced, the band width can be widened, and the flatness in the band can also be enhanced.

Accordingly, in order to extract a signal component of a required frequency band, the stagger tuning system is often more advantageous than the single tuning system.

The foregoing related art is disclosed in non-patent document 1 set forth below, and for example, the features of the biquad circuit and the transfer function are detailed in Chapter 5, the stagger tuning is detailed in Chapter 7, and the switched capacitor is detailed in Chapter 17.

Non-patent document 1 (Japanese version)

Design of Analog Filter [Author: M. E. VAV VALKEN-BURG Translator: Hajime Kanai Publisher: Kabusiki Kaisha Sangyo Houchi Center Publication of first edition: Mar. 25, 1985]

Non-patent document 1 (English version)

Analog Filter Design [Author: M. E. VAV VALKEN-BURG Publisher: CBS College Publication: 1982]

However, in the stagger tuning system, in the case where the characteristic of the fourth order band pass filter is made variable in the state where the band width is fixed, it is necessary that the difference (offset) between the center frequencies of the respective second order band pass filters is fixed, and the respective center frequencies are made variable.

In order to make the center frequencies of the pair of the second order band pass filters variable while the offset of the center frequencies is fixed, in both the case of the multiple feedback type and the biquad type, the calculation of resistance values for determining the center frequency, the maximum gain or the like becomes complicated.

Thus, in the case where variable resistors or the like are used, in order to keep the band width of the fourth order band pass filter constant, it is necessary that the center frequency adjusting resistors of the respective second order band pass filters are separately adjusted to target resistance values.

Besides, in the fourth order band pass filter, when only the center frequency is changed by using a switched capacitor or the like and by changing a resistance value by a control signal from the outside, it is necessary to separately give control signals ($f_{CLK}$) having different frequencies to the switched capacitors of the two second order band pass filters, and there has been a problem that a circuit scale becomes large.

SUMMARY OF THE INVENTION

The invention has been made to solve the problems as stated above, and in a high order band pass filter of a stagger tuning system obtained by series connecting plural biquad type band pass filters having different center frequencies, an object is to provide a band pass filter which can make a center frequency and/or a maximum gain variable by a simple circuit structure and in a state where a band width is fixed.

A band pass filter of the invention includes a first band pass filter constructed of a biquad circuit and having a first center frequency, and a second band pass filter constructed of a biquad circuit and having a second center frequency different from the first center frequency, and is a band pass filter of a stagger tuning system in which the first band pass filter and the second band pass filter are series connected, wherein the first band pass filter and the second band pass filter respectively have center frequency adjusting variable resistors varied at the same time, and a fixed resistor is connected in parallel to the center frequency adjusting variable resistor of one of the first band pass filter and the second band pass filter.

Therefore, according to the band pass filter of the invention, while the band width and the maximum gain are kept fixed, only the center frequency can be made variable in a state where a specific offset is given to the center frequency.

The first band pass filter and the second band pass filter of the band pass filter of the invention further include maximum gain adjusting variable resistors for adjusting the maximum gain.

Therefore, according to the band pass filter of the invention, while the band width is kept fixed, only the center frequency can be made variable in a state where the specific offset is given to the center frequency, and the maximum gain can also be made variable.

At least one of the center frequency adjusting variable resistors and the maximum gain adjusting variable resistors of the band pass filter of the invention is realized by a switched capacitor or a switched resistor.

Therefore, according to the band pass filter of the invention, while the band width and the maximum gain are kept fixed, one of or both of the center frequency and the maximum gain can be made easily variable by a control signal from the outside in the state where the specific offset is given to the center frequency.

The foregoing and other objects, features, aspects and advantages of the present invention will become more apparent from the following detailed description of the present invention when taken in conjunction with the accompanying drawings.

DETAILED DESCRIPTION OF THE INVENTION

Hereinafter, embodiments of the invention will be described with reference to the drawings.

In the respective drawings, same symbols denote same or equivalent parts.

EMBODIMENT 1

Figure 1:
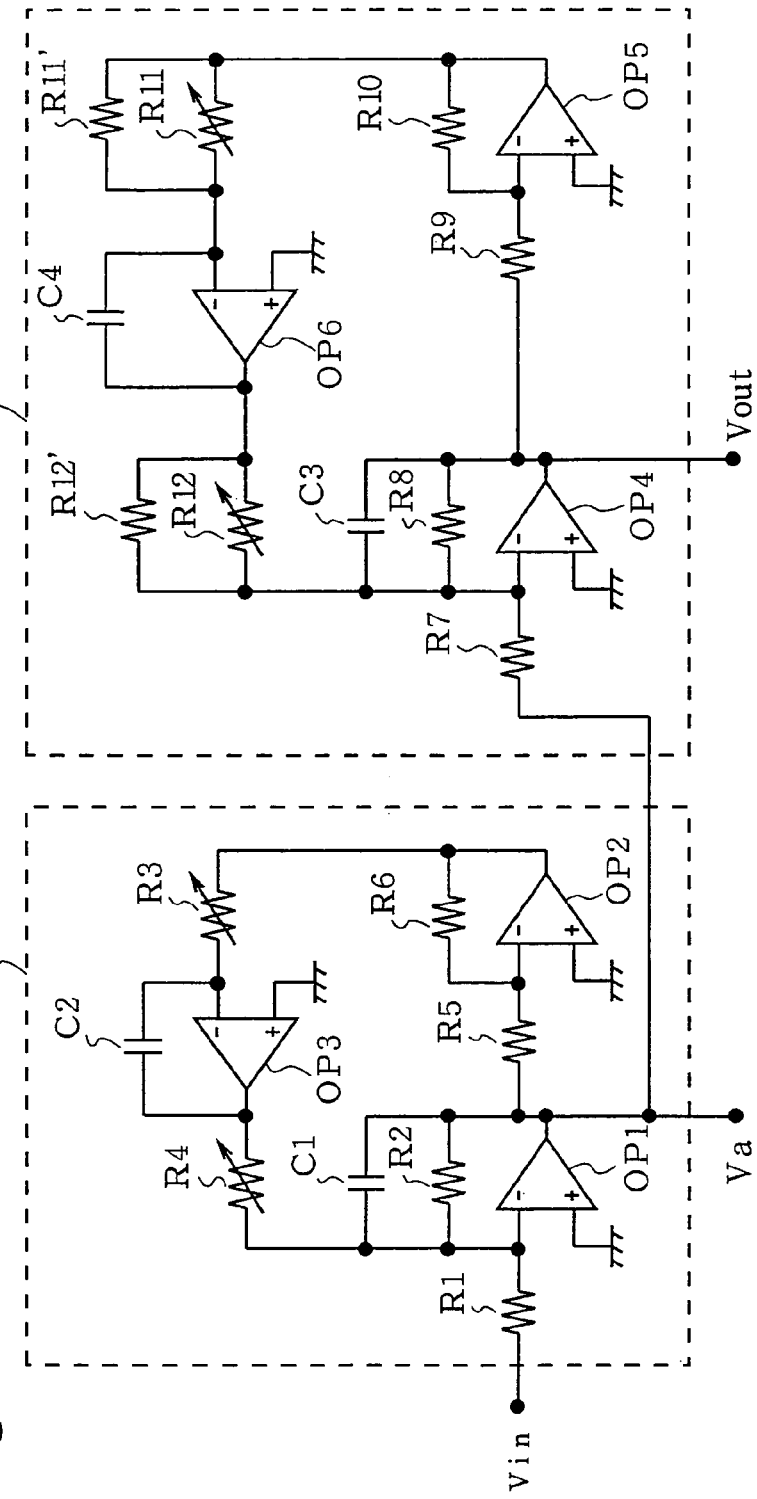
FIG. 1 is a view showing a circuit structure of a band pass filter according to embodiment 1.

FIG. 1 is a view showing a circuit structure of a band pass filter according to embodiment 1.

The band pass filter shown in FIG. 1 is a fourth order band pass filter of a stagger tuning system obtained by series connecting a pair of second order band pass filters having different center frequencies and constructed of biquad circuits.

Figure 7:
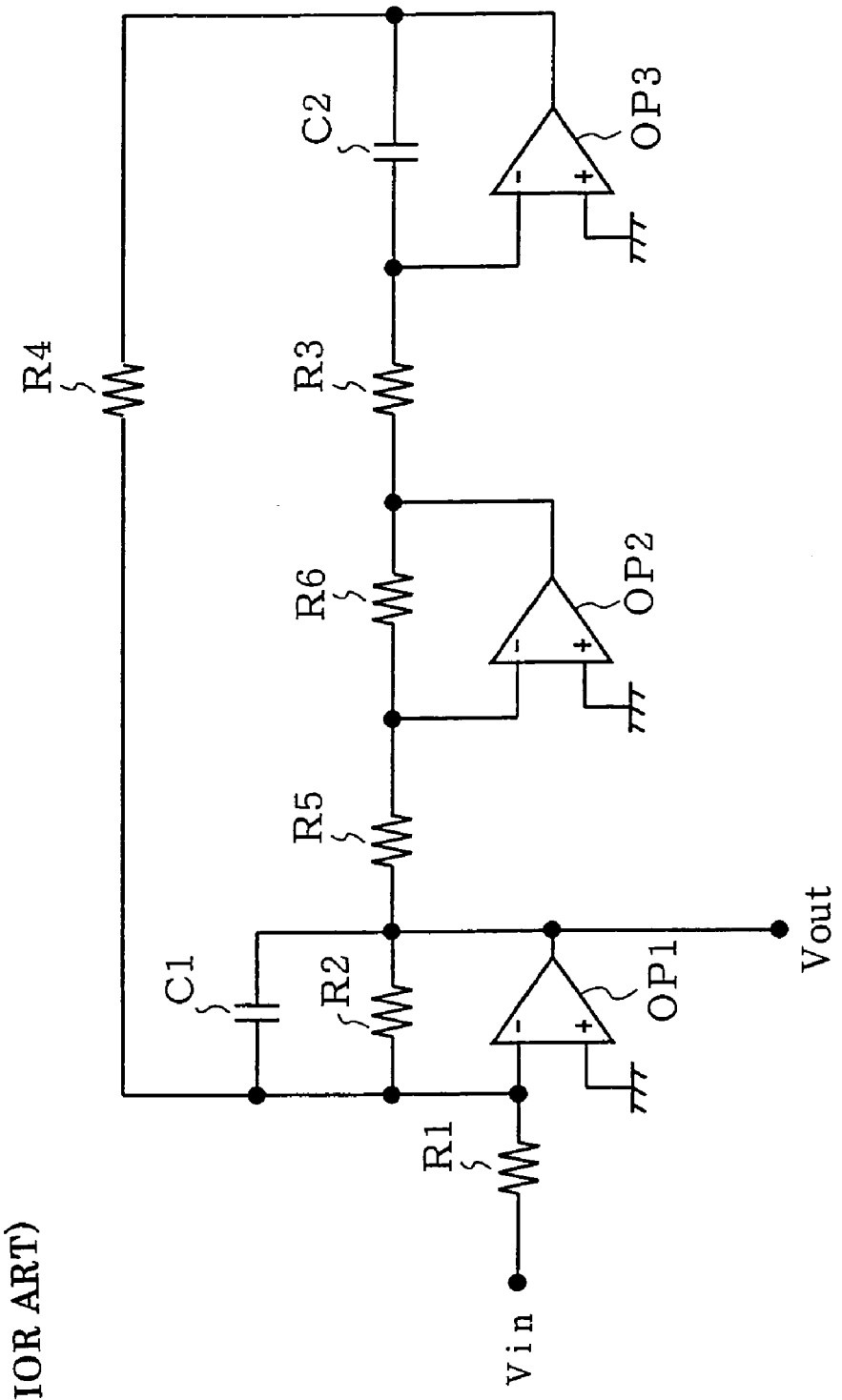
FIG. 7 is a view showing a circuit structure of a second order band pass filter of a biquad circuit.
Figure 8:
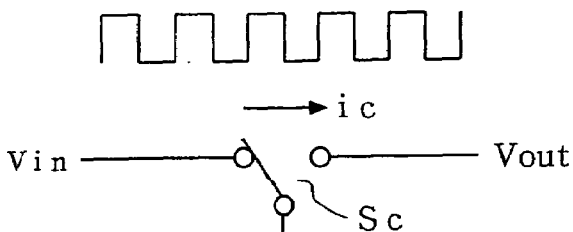
FIG. 8 is a model diagram of a switched capacitor.
Figure 8:
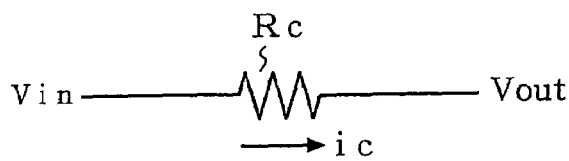
Figure 9:
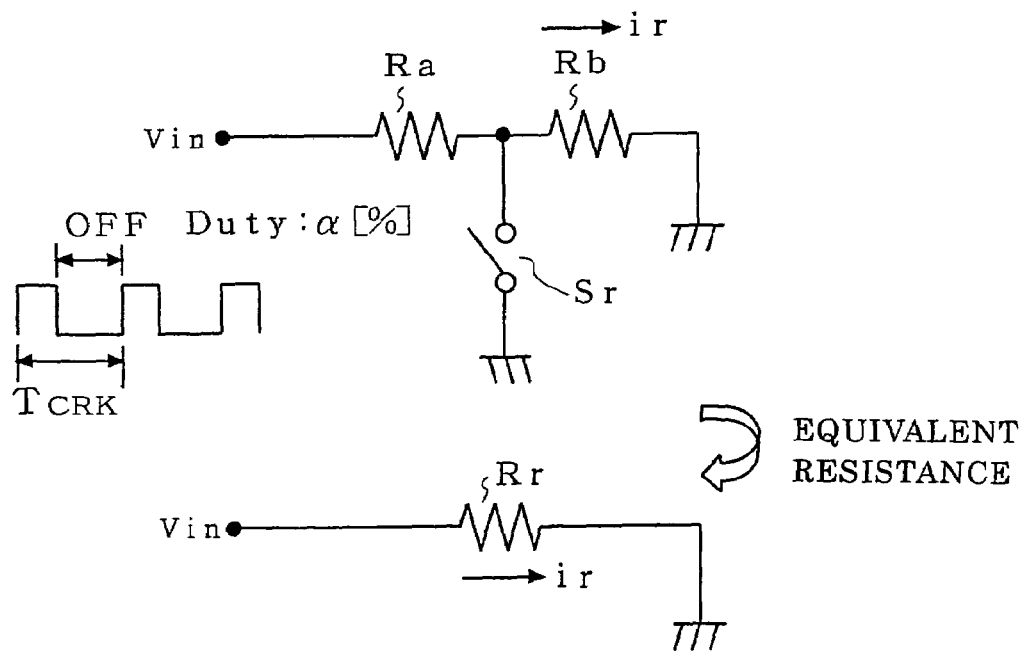
FIG. 9 is a model diagram of a switched resistor.
Figure 10:
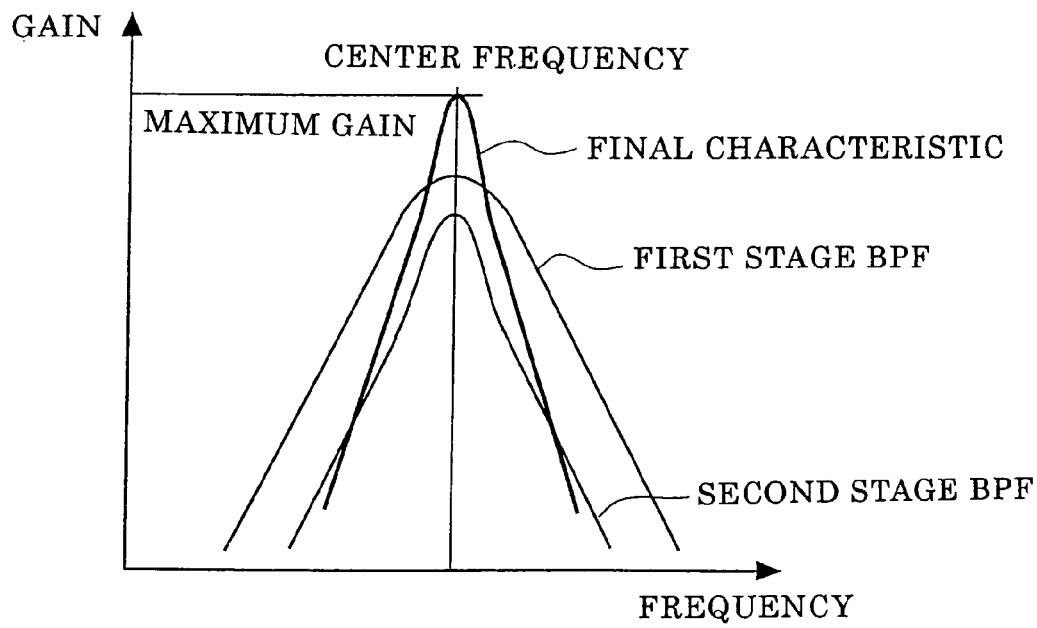
FIG. 10 is a view showing characteristics of a fourth order band pass filter of a single tuning system.
Figure 11:
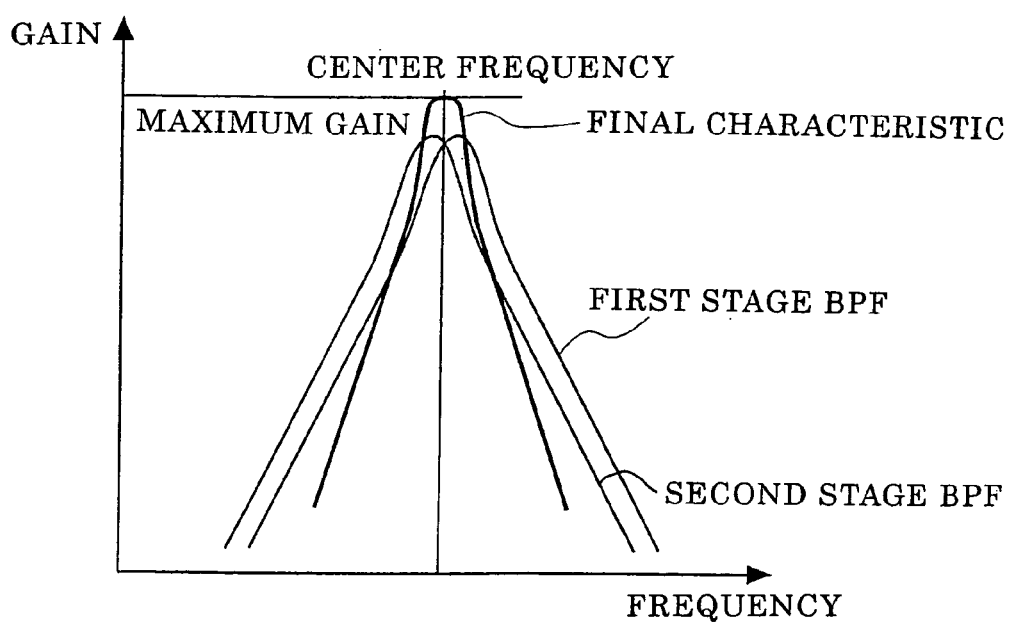
FIG. 11 is a view showing characteristics of a fourth order band pass filter of a stagger tuning system.

In the drawing, reference numeral 11 denotes a first stage second order band pass filter (first band pass filter), and its circuit structure is such that the resistor R3 and the resistor R4 in the biquad circuit shown in FIG. 7 are made variable resistors.

Reference numeral 21 denotes a second stage second order band pass filter (second band pass filter), and its circuit structure is such that each of the resistor R3 and the resistor R4 in the biquad circuit shown in FIG. 7 is replaced by a fixed resistor and a variable resistor connected in parallel to each other.

In the drawing, R1, R2, R5, R6, R7, R8, R9, R10, R11' and R12' denote fixed resistors, R3, R4, R11 and R12 denote variable resistors, C1, C2, C3 and C4 denote fixed capacitors, and OP1, OP2, OP3 and OP4 denote operational amplifiers.

First, the respective characteristics (that is, maximum gain ($G_{01}$), band width ($\omega_{b1}$), and center frequency ($\omega_{01}$)) concerning the first stage second order band pass filter 11 as the first band pass filter (that is, the second order band pass filter whose input is Vin and whose output is Va) are expressed by following expressions.

$G_{01} = R2/R1$ $\omega_{b1} = 1/(C1*R2)$ $\omega_{01} = \sqrt{R6/(C1*C2*R3*R4*R5)}$ Here, when resistance values are set to satisfy R4=R3, and R5=R6, the center frequency ($\omega_{01}$) can be expressed by $\omega_{01} = 1/R3*\sqrt{1/(C1*C2)}$.

Next, the respective characteristics (maximum gain ($G_{02}$), band width ($\omega_{b2}$), and center frequency ($\omega_{02}$))

concerning the second stage second order band pass filter 21 as the second band pass filter (that is, the second order band pass filter whose input is Va and whose output is Vout) are expressed by following expressions.

$$G02=R8/R7$$

$$\omega b2=1/(C3*R8)$$

$$\omega 02=\text{sqrt}((1/R11+1/R11')*(1/R12+1/R12')*R10/(C3*C4*R9))$$

Here, when resistance values are set to satisfy R12=R11, R12'=R11', and R9=R10, the center frequency ($\omega 02$) can be expressed by $$\omega 02=(1/R11+1/R11)*\text{sqrt}(1/(C3*C4))$$

A difference $\Delta\omega 0$ between the center frequency $\omega 01$ of the first stage second order band pass filter 11 and the center frequency $\omega 02$ of the second stage second order band pass filter 21 is the offset of the center frequency.

The band width of the fourth order band pass filter (that is, the fourth order band pass filter of the stagger tuning system in which the first stage second order band pass filter 11 and the second stage second order band pass filter 21 are series connected) is calculated by the difference between the respective center frequencies of the pair of the second order band pass filters and the respective band widths.

Accordingly, when the difference between the respective center frequencies and the respective band widths can be fixed, the band width of the fourth order band pass filter can be fixed.

Then, in the fourth order band pass filter shown in FIG. 1, when capacitor capacitances and resistance values are set to satisfy C1×C2=C3×C4, and R3=R11, the difference $\Delta\omega 0$ of the respective center frequencies and the respective band widths $\omega b1$ and $\omega b2$ become $$\Delta\omega 0=\omega 02-\omega 01=1/R11'*\text{sqrt}(1/(C1*C2))$$

$$\omega b1=1/(C1*R2)$$

$$\omega b2=1/(C3*R8)$$

Accordingly, since the difference $\Delta\omega 0$ of the respective center frequencies of the pair of the second order band pass filters and the respective band widths $\omega b1$ and $\omega b2$ are fixed, the band width of the fourth order band pass filter is also theoretically fixed.

In the case where the center frequency of the fourth order band pass filter is made variable, it maybe made variable while R3=R4=R11=R12 is kept established.

As described above, the band pass filter of this embodiment includes the first band pass filter (first stage second order band pass filter 11) constructed of the biquad circuit and having the first center frequency and the second band pass filter (second stage second order band pass filter 21) constructed of the biquad circuit and having the second center frequency different from the first center frequency, and is the band pass filter of the stagger tuning system in which the first band pass filter 11 and the second band pass filter 21 are series connected. The first band pass filter and the second band pass filter respectively include the center frequency adjusting variable resistors (R3, R4, R11, R12) varied at the same time, and the fixed resistor is connected in parallel to the center frequency adjusting variable resistor of one of the first band pass filter and the second band pass filter.

Accordingly, while the band width and the maximum gain are kept fixed, only the center frequency can be varied in the state where the specific offset is given to the center frequency.

EMBODIMENT 2

Figure 2:
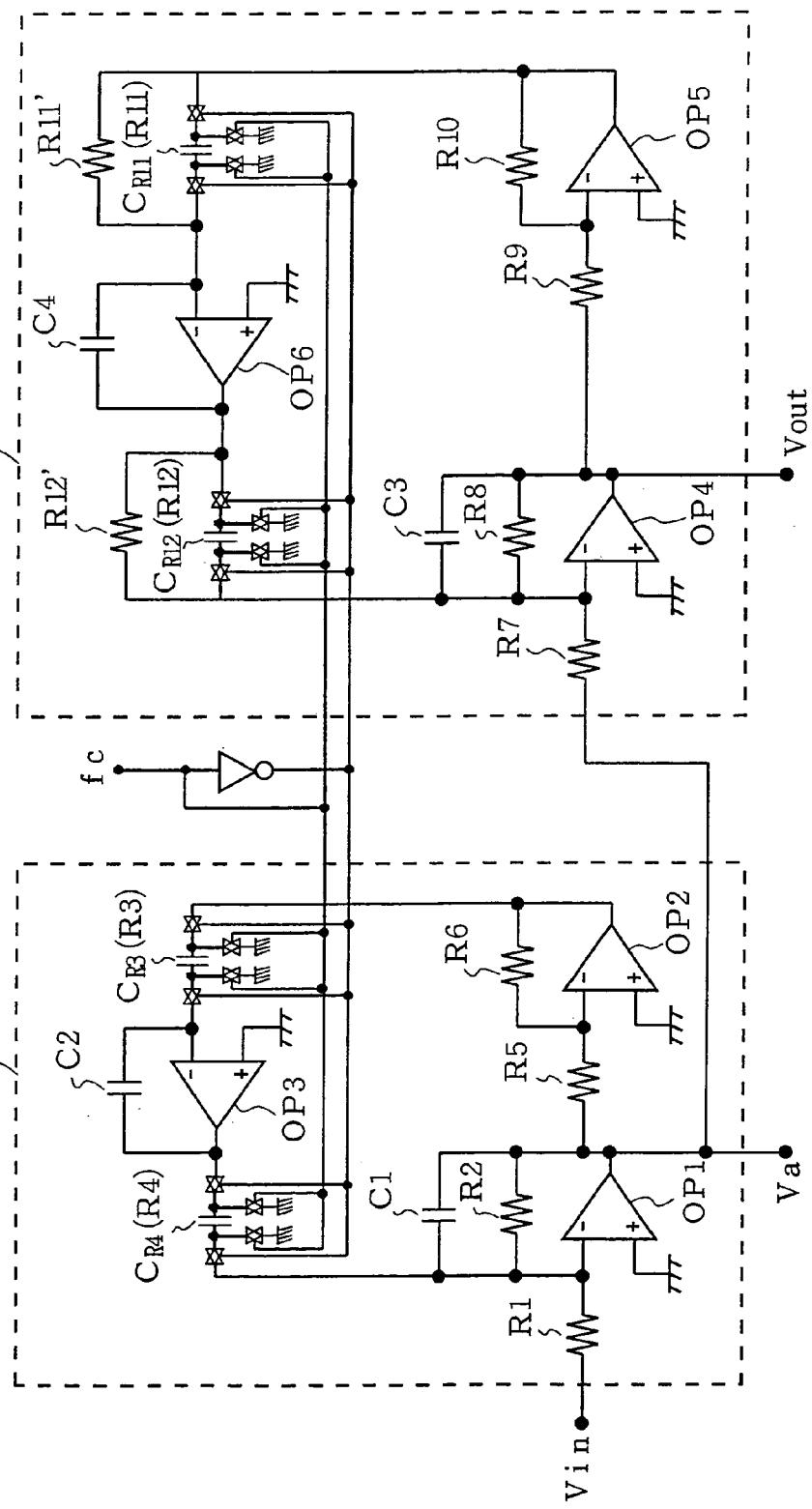
FIG. 2 is a view showing a circuit structure of a band pass filter according to embodiment 2.

FIG. 2 is a view showing a circuit structure of a band pass filter according to embodiment 2.

The circuit structure of FIG. 2 is such that in FIG. 1 showing the circuit structure of the band pass filter according to embodiment 1, the variable resistors R3, R4, R11 and R12 are replaced by switched capacitors.

In the drawing, reference numeral 12 denotes a first stage second order band pass filter (first band pass filter), and 22 denotes a second stage second order band pass filter (second band pass filter).

Besides, $C_{R3}$, $C_{R4}$, $C_{R11}$ and $C_{R12}$ denote switched capacitors respectively corresponding to the variable resistor R3, the variable resistor R4, the variable resistor R11 and the variable resistor 12.

First, the respective characteristics (maximum gain (G01), band width ($\omega b1$), and center frequency ($\omega 01$)) concerning the first stage second order band pass filter 12 as the first band pass filter (that is, the second order band pass filter whose input is Vin and whose output is Va) are expressed using a switched capacitor control signal fc by following expressions.

$$G01=R2/R1$$

$$\omega b1=1/(C1*R2)$$

$$\omega 01=fc*\text{sqrt}((C_{R3}*C_{R4}*R6)/(C1*C2*R5))$$

Here, when capacitor capacitances and resistance values are set to satisfy $C_{R4}=C_{R3}$, and R5=R6, the center frequency ($\omega 01$) can be expressed by $$\omega 01=fc*C_{R3}*\text{sqrt}(1/(C1*C2)).$$

Next, the respective characteristics (maximum gain (G01), band width ($\omega b2$), and center frequency ($\omega 02$)) concerning the second stage second order band pass filter 22 as the second band pass filter (that is, the band pass filter whose input is Va and whose output is Vout) are expressed by following expressions.

$$G02=R8/R7$$

$$\omega b2=1/(C3*R8)$$

$$\omega 02=\text{sqrt}((fc*C_{R11}+1/R11')*(fc*C_{R12}+1/R12')*R10/(C3*C4*R9)).$$

Here, when capacitor capacitances and resistance values are set to satisfy $C_{R12}=C_{R11}$, R12'=R11', and R9=R10, the center frequency ($\omega 02$) is expressed by $$\omega 02=(fc*C_{R11}+1/R11')*\text{sqrt}(1/(C3*C4)).$$

The band width of the fourth order band pass filter (that is, the fourth order band pass filter of the stagger tuning system in which the first stage second order band pass filter 12 and the second stage second order band pass filter 22 are series connected) is calculated by the difference between the respective center frequencies of the pair of the second order band pass filters and the respective band widths.

Accordingly, when the difference between the respective center frequencies and the respective bandwidths can be fixed, the bandwidth of the fourth order band pass filter can be fixed.

Then, in the fourth order band pass filter shown in FIG. 2, when capacitor capacitances are set to satisfy C1×C2=C3×C4, and $C_{R3}=C_{R11}$, the difference $\Delta\omega 0$ between the respective center frequencies and the respective band widths $\omega b1$ and $\omega b2$ become $\Delta\omega 0=\omega 02-\omega 01=1/R11'*\text{sqrt}(1/(C1*C2))$ $\omega b1=1/(C1*R2)$ $\omega b2=1/(C3*R8)$ Accordingly, since the difference $\Delta\omega 0$ between the respective center frequencies of the pair of the second order band pass filters and the respective band widths •b1 and $\omega b2$ are fixed, the band width of the fourth band pass filter is also theoretically fixed.

In the case where the center frequency of the fourth order band pass filter is made variable, it maybe made variable while $C_{R3}=C_{R4}=C_{R11}=C_{R12}$ is kept established, or $C_{R3}=C_{R4}=C_{R11}=C_{R12}$ is fixed and the frequency of the switched capacitor control signal fc may be changed.

In this case, the frequency of the switched capacitor control signal fc and the center frequency of the fourth order band pass filter have a linear relation.

As described above, the band pass filter of this embodiment is such that in the band pass filter of embodiment 1, the center frequency adjusting resistors R3, R4, R11 and R12 are replaced by the switched capacitors $C_{R3}$, $C_{R4}$, $C_{R11}$ and $C_{R12}$ which can vary the equivalent resistance values by the control signal (fc) from the outside, while the bandwidth and the maximum gain are kept fixed, only the center frequency can be easily made variable by the control signal (fc) in the state where the specific offset is given to the center frequency.

EMBODIMENT 3

Figure 3:
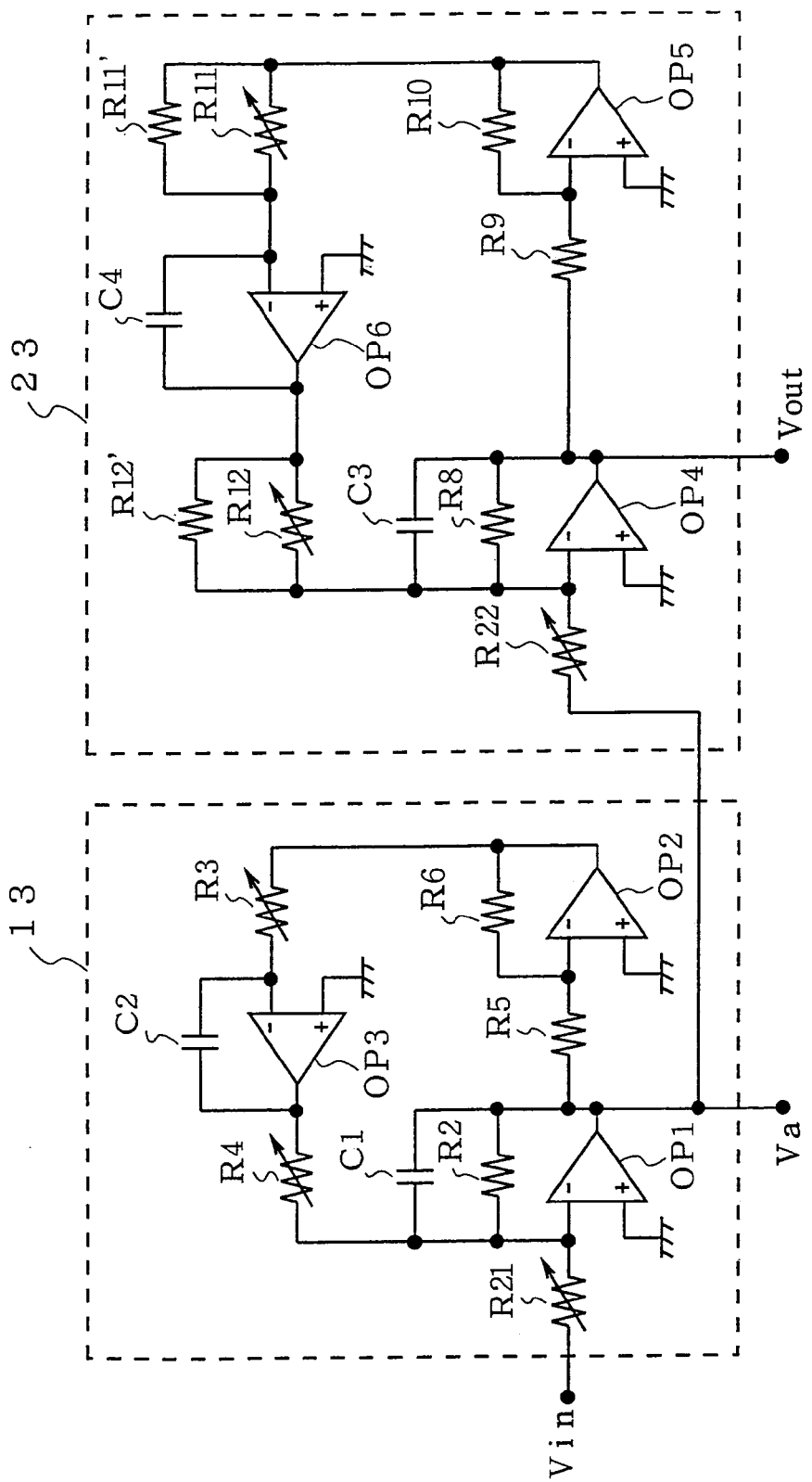
FIG. 3 is a view showing a circuit structure of a band pass filter according to embodiment 3.

FIG. 3 is a view showing a circuit structure of a band pass filter according to embodiment 3.

In the circuit of the band pass filter according to embodiment 1 and shown in FIG. 1, the resistance values of R1 R7 are fixed, and the maximum gain is also fixed. On the other hand, in the circuit structure of the band pass filter according to this embodiment, as shown in FIG. 3, instead of the fixed resistors R1 and R7, variable resistors R21 and R22 are used to adjust the maximum gain.

In the drawing, reference numeral 13 denotes a first stage second order band pass filter (first band pass filter); 23, a second stage second order band pass filter (second band pass filter); R21, a variable resistor for adjusting the maximum gain of the first band pass filter 13; and R22, a variable resistor for adjusting the maximum gain of the second band pass filter 23.

First, the respective characteristics (maximum gain (G01), band width ($\omega b1$), and center frequency ($\omega 01$)) concerning the first stage second order band pass filter 13 as the first band pass filter (that is, the second order band pass filter whose input is Vin and whose output is Va) are expressed by following expressions.

$G01=R2/R21$ $\omega b1=1/(C1*R2)$ $\omega 01=\text{sqrt}(R6/(C1*C2*R3*R4*R5))$.

Here, when resistance values are set to satisfy R4=R3, and R5=R6, the center frequency ($\omega 01$) can be expressed by $\omega 01=1/R3*\text{sqrt}(1/(C1*C2))$.

Next, the respective characteristics (maximum gain (G02), band width ($\omega b2$), and center frequency ($\omega 02$)) concerning the second stage second order band pass filter 23 as the second band pass filter (that is, the second order band pass filter whose input is Va and whose output is Vout) are expressed by following expressions.

$G02=R8/R22$ $\omega b2=1/(C3*R8)$ $\omega 02=\text{sqrt}((1/R11+1/R11')*(1/R12+1/R12')*R10/(C3*C4*R9))$.

Here, when resistance values are set to satisfy R12=R11, R12'=R11', and R9=R10, the center frequency ($\omega 02$) can be expressed by $\omega 02=(1/R11+1/R11')*\text{sqrt}(1/(C3*C4))$.

Since the band width of the fourth order band pass filter (that is, the fourth order band pass filter of the stagger tuning system in which the first stage second order band pass filter 13 and the second stage second order band pass filter 23 are series connected) is calculated by the difference between the respective center frequencies of the pair of the second order band pass filters and the respective band widths, when the difference between the respective center frequencies and the respective band widths can be fixed, the band width of the fourth band pass filter can be fixed.

Then, in the fourth order band pass filter shown in FIG. 3, when capacitor capacitances and resistance values are set to satisfy C1×C2=C3×C4, and R3=R11, the difference $\Delta\omega 0$ between the respective center frequencies and the respective band widths $\omega b1$ and $\omega b2$ become $\Delta\omega 0=\omega 02-\omega 01=1/R11'*\text{sqrt}(1/(C1*C2))$ $\omega b1=1/(C1*R2)$ $\omega b2=1/(C3*R8)$.

Accordingly, since the difference $\Delta\omega 0$ between the respective center frequencies of the pair of the second order band pass filters and the respective band widths $\omega b1$ and $\omega b2$ are fixed, the band width of the fourth order band pass filter is also theoretically fixed.

In the case where the center frequency of the fourth order band pass filter is made variable, it may be made variable while R3=R4=R1=R12 is kept established.

Further, with respect to the maximum gain of the fourth band pass filter, when the maximum gain of the second order band pass filter of at least one of the pair of the second order band pass filters can be made variable, the maximum gain of the fourth order band pass filter can be made variable.

The respective maximum gains of the pair of the second order band pass filters are given by $G01=R2/R21$ $G02=R8/R22$.

Accordingly, when R21 and/or R22 is made variable, the maximum gain of the fourth order band pass filter can be made variable.

As described above, according to the band pass filter of this embodiment, in the band pass filter of the embodiment 1, the first band pass filter 13 and the second band pass filter 23 further include the maximum gain adjusting variable resistors (R21, R22) for adjusting the maximum gain. Thus, while the band width is kept fixed, only the center frequency can be made variable in the state where the specific offset is given to the center frequency, and the maximum gain can also be made variable.

EMBODIMENT 4

Figure 4:
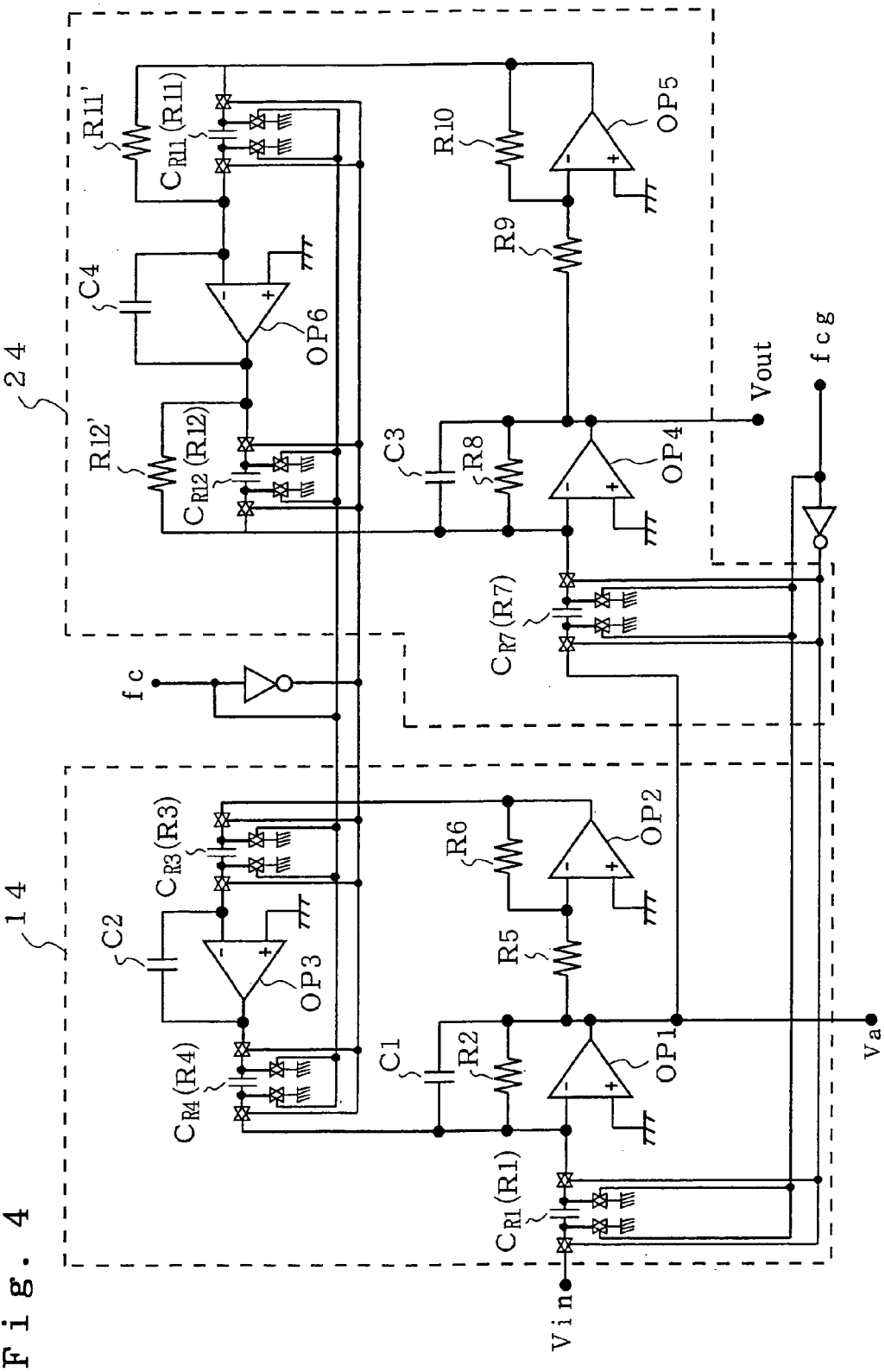
FIG. 4 is a view showing a circuit structure of a band pass filter according to embodiment 4.
Figure 5:
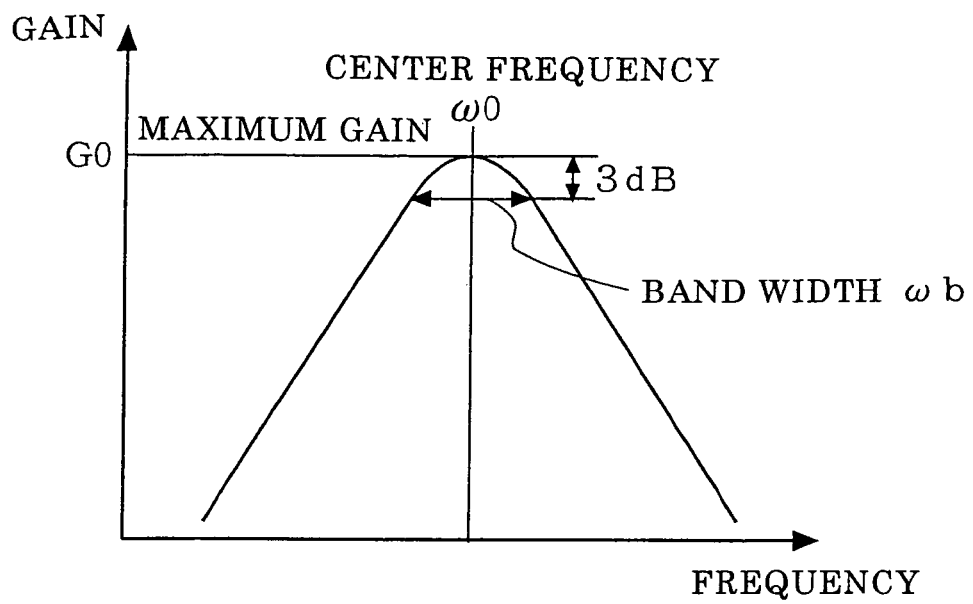
FIG. 5 is a view showing characteristics of a general second order band pass filter.
Figure 6:
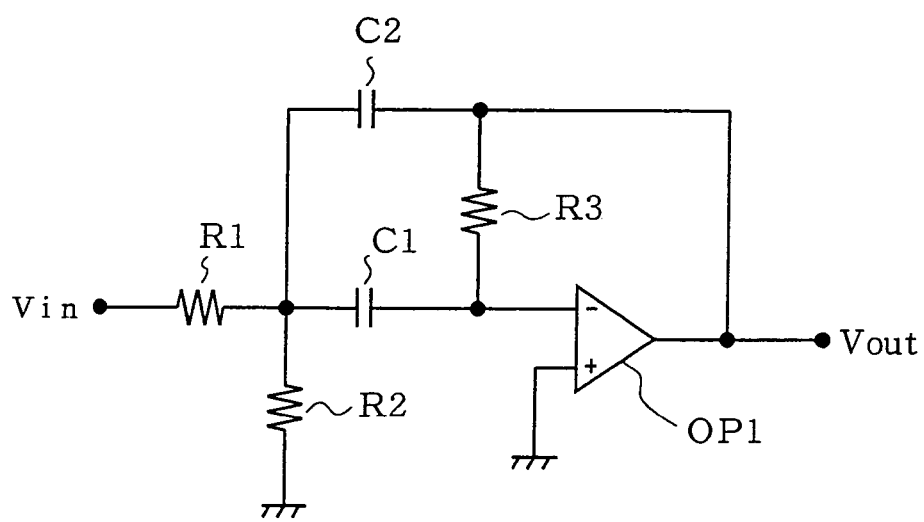
FIG. 6 is a view showing a circuit structure of a multiple feedback type second order band pass filter.

FIG. 4 is a view showing a circuit structure of a band pass filter according to embodiment 4.

The band pass filter of this embodiment is such that in FIG. 2 showing the structure of the band pass filter according to embodiment 2, the fixed resistor R1 and the fixed resistor R7 are replaced by switched capacitors.

In the drawing, reference numeral 14 denotes a first stage second order band pass filter (first band pass filter); 24, a second stage second order band pass filter (second band pass filter); and $C_{R1}$, $C_{R7}$, switched capacitors respectively corresponding to the variable resistor R1 and the variable resistor R7 for the maximum gain adjustment shown in FIG. 2.

A switched capacitor control signal fcg used for the switched capacitor $C_{R1}$ and $C_{R7}$ as variable resistors for controlling the maximum gain is set separately from the switched capacitor control signal fc used for the switched capacitors $C_{R3}$, $C_{R4}$, $C_{R11}$, and $C_{R12}$ for controlling the center frequencies.

First, the respective characteristics (maximum gain (G01), band width ($\omega b1$), and center frequency ($\omega 01$)) concerning the first stage second order band pass filter 14 (that is the second order band pass filter whose input is Vin and whose output is Va) are expressed by following expressions.

$$G01=R2*fcg*C_{R1}$$

$$\omega b1=1/(C1*R2)$$

$$\omega 01=fc*\text{sqrt}((C_{R3}*C_{R4}*R6)/(C1*C2*R5)).$$

Here, when capacitor capacitances and resistance values are set to satisfy $C_{R4}=C_{R3}$, and R5=R6, the center frequency ($\omega 01$) can be expressed by $$\omega 01=fc*C_{R3}*\text{sqrt}(1/(C1*C2)).$$

Next, the respective characteristics (maximum gain (G02), band width ($\omega b2$), and center frequency ($\omega 02$)) concerning the second stage second order band pass filter 24 as the second band pass filter (that is, the second order band pass filter whose output is Va and whose output is Vout) are expressed by following expressions.

$$G02=R8*fcg*C_{R7}$$

$$\omega b2=1/(C3*R8)$$

$$\omega 02=\text{sqrt}((fc*C_{R11}+1/R11')*(fc*C_{R12}+1/R12')*R10/(C3*C4*R9))$$

Here, capacitor capacitances and resistance values are set to satisfy $C_{R12}=C_{R11}$, R12'=R11', and R9=R10, the center frequency ($\omega 02$) can be expressed by $$\omega 02=(fc*C_{R11}+1/R11')*\text{sqrt}(1/(C3*C4)).$$

The band width of the fourth order band pass filter (that is, the fourth order band pass filter of the stagger tuning system in which the first stage second order band pass filter 14 and the second stage second order band pass filter 24 are series connected) is calculated by the difference between the respective center frequencies of the pair of the second order band pass filters and the respective band widths.

Accordingly, when the difference between the respective center frequencies and the respective band widths can be fixed, the band width of the fourth order band pass filter can be fixed.

Then, in the fourth order band pass filter shown in FIG. 4, when capacitor capacitances are set to satisfy C1×C2=C3×C4 and $C_{R3}=C_{R11}$, the difference $\Delta\omega 0$ between the respective center frequencies and the respective band widths $\omega b1$ and $\omega b2$ become $$\Delta\omega 0=\omega 02-\omega 01=1/R11'*\text{sqrt}(1/C1*C2))$$

$$\omega b1=1/(C1*R2)$$

$$\omega b2=1/(C3*R8).$$

Accordingly, since the difference $\Delta\omega 0$ between the respective center frequencies of the pair of the second order band pass filters and the respective band widths $\omega b1$ and $\omega b2$ are fixed, the band width of the fourth order band pass filter is also theoretically fixed.

In the case where the center frequency of the fourth order band pass filter is made variable, it may be made variable while $C_{R3}=C_{R4}=C_{R11}=C_{R12}$ is kept established, or the frequency of the switched capacitor control signal fc may be changed while $C_{R3}=CR_4=C_{R11}=C_{R12}$ is fixed.

In this case, the frequency of the switched capacitor control signal fc and the center frequency of the fourth order band pass filter have a linear relation.

Further, with respect to the maximum gain of the fourth order band pass filter, when the maximum gain of the second order band pass filter of at least one of the pair of the second order band pass filters can be made variable, the maximum gain of the fourth order band pass filter can be made variable.

The respective maximum gains of the pair of the second order band pass filters are given by $$G01=R2*fcg*C_{R1}$$

$$G02=R8*fcg*C_{R7}$$

Accordingly, when the capacitor capacitances of $C_{R1}$ and $C_{R7}$ are made variable, or $C_{R1}$ and $C_{R7}$ are fixed and the frequency of the switched capacitor control signal fcg is changed, the maximum gain of the fourth order band pass filter can be made variable.

Here, although the circuit structure is such that both $C_{R1}$ and $C_{R7}$ are changed at the same time, only one of them is made a switched capacitor, and the other may be made a fixed resistor, or different switched capacitor control signals may be used for $C_{R1}$ and $C_{R7}$.

Incidentally, in the embodiments 1 to 4, although the method has been described in which the variable resistors and the switched capacitors are used to make the resistance values variable, in addition to the variable resistors and the switched capacitors, the invention can also be realized by such a method that a switched resister whose resistance value is made variable by switching is used, or plural fixed resistors having different resistance values are prepared in advance, and the resistance value is changed by an analog switch.

It is needless to say that the invention can also be realized by combining the methods of making the resistance values variable.

Further, here, although the description has been given to the example in which the variability is achieved while the variable resistor value is kept at the same value, as is conceivable from the theoretical expression, the resistance value may be made variable under the condition that the ratio of the resistance and capacitor capacitance having an influence on the respective filter characteristics is fixed.

As described above, in the band pass filter of this embodiment, since at least one of the center frequency adjusting variable resistor and the maximum gain adjusting variable resistor is realized by the switched capacitor or switched resister, one of or both of the center frequency and the maximum gain can be easily made variable by a control signal from the outside in the state where the band width is fixed and the specific offset is given to the center frequency.

EMBODIMENT 5

The band pass filter described in the embodiments 1 to 4 can be used as the filter for processing knock sensor signals of an internal combustion engine (for example, vehicle engine)

In general, although the band width of the knock signal is considered to be approximately 1 kHz, since a noise component in the vicinity of the knock frequency is large, an attenuation characteristic is required which is flat in the knock frequency and is high in a range other than that.

Then, when a high order band pass filter of a stagger tuning system is used, detection of knocking can be performed effectively.

Further, although the knock frequency is changed according to the type of an engine and an operation area, knock frequency bands often become almost constant in vehicle engines or the like irrespective of the types of the engines.

Then, when the gain and the center frequency can be made variable while the band width is fixed, the band pass filter can support any engine.

Accordingly, when the band pass filter of embodiment 1 to 4 is used, the same circuit structure can support many engines, and the center frequency can be changed according to the operation area. Thus, the commonality of the electronic circuit is achieved, and as compared with the conventional fixed type band pass filter, the detectability of knocking is improved.

While the presently preferred embodiments of the present invention have been shown and described.

It is to be understood that these disclosures are for the purpose of illustration and that various changes and modifications may be made without departing from the scope of the invention as set forth in the appended claims.

What is claimed is:

1. A band pass filter comprising:
   a first band pass filter constructed of a biquad circuit and having a first center frequency; and
   a second band pass filter constructed of a biquad circuit and having a second center frequency different from the first center frequency, the first band pass filter and the second band pass filter being series connected so that the band pass filter is of a stagger tuning system,
   wherein the first band pass filter and the second band pass filter respectively have center frequency adjusting variable resistors varied at the same time, and a fixed resistor is connected in parallel to the center frequency adjusting variable resistor of one of the first band pass filter and the second band pass filter.

2. A band pass filter according to claim 1, wherein the first band pass filter and the second band pass filter include maximum gain adjusting variable resistors for adjusting a maximum gain.

3. A band pass filter according to claim 1, wherein at least one of the center frequency adjusting variable resistors and the maximum gain adjusting variable resistors is realized by a switched capacitor or a switched resistor.

4. A band pass filter according to claim 2, wherein at least one of the center frequency adjusting variable resistors and the maximum gain adjusting variable resistors is realized by a switched capacitor or a switched resistor.

5. A band pass filter according to claim 1, wherein the band pass filter is used for processing a knock sensor output signal of an internal combustion engine.

6. A band pass filter according to claim 2, wherein the band pass filter is used for processing a knock sensor output signal of an internal combustion engine.

7. A band pass filter according to claim 3, wherein the band pass filter is used for processing a knock sensor output signal of an internal combustion engine.

8. A band pass filter according to claim 4, wherein the band pass filter is used for processing a knock sensor output signal of an internal combustion engine.

9. A band pass filter according to claim 1, wherein the band width of the band pass filter is fixed while the center frequency or the maximum gain of the band pass filter is variable.

* * * * *